(12) United States Patent
Sai et al.

(10) Patent No.: US 7,482,959 B2
(45) Date of Patent: Jan. 27, 2009

(54) D/A CONVERTER AND COMMUNICATION APPARATUS

(75) Inventors: Akihide Sai, Kawasaki (JP); Takeshi Ueno, Kawasaki (JP); Takafumi Yamaji, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 441 days.

(21) Appl. No.: 11/319,106

(22) Filed: Dec. 27, 2005

(65) Prior Publication Data

US 2006/0139191 A1 Jun. 29, 2006

(30) Foreign Application Priority Data

Dec. 28, 2004 (JP) ............... 2004-381894

(51) Int. Cl.
*H03M 1/66* (2006.01)
(52) U.S. Cl. .................. 341/144; 341/135; 341/136; 341/148
(58) Field of Classification Search ................ 341/144, 341/145, 153, 135, 136, 44, 148
See application file for complete search history.

(56) References Cited

U.S. PATENT DOCUMENTS

| | | | | | |
|---|---|---|---|---|---|
| 4,405,916 | A | * | 9/1983 | Hornak et al. ............... | 341/118 |
| 4,695,826 | A | * | 9/1987 | Ando et al. .................. | 341/144 |
| 5,221,890 | A | * | 6/1993 | Shyu et al. ................... | 323/317 |
| 5,689,258 | A | * | 11/1997 | Nakamura et al. .......... | 341/136 |
| 5,905,452 | A | * | 5/1999 | Baek .......................... | 341/136 |
| 5,995,030 | A | * | 11/1999 | Cabler ........................ | 341/143 |
| 6,329,940 | B1 | * | 12/2001 | Dedic .......................... | 341/144 |
| 6,825,787 | B2 | * | 11/2004 | Lin .............................. | 341/144 |
| 6,967,609 | B1 | * | 11/2005 | Bicakci et al. .............. | 341/144 |
| 6,992,609 | B1 | * | 1/2006 | Zelenin et al. .............. | 341/144 |
| 7,009,544 | B2 | * | 3/2006 | Huang ........................ | 341/144 |
| 7,064,695 | B2 | * | 6/2006 | Koo ............................ | 341/136 |
| 7,292,172 | B2 | * | 11/2007 | Matsumoto et al. ......... | 341/144 |
| 2004/0104832 | A1 | * | 6/2004 | Bugeja ....................... | 341/145 |

FOREIGN PATENT DOCUMENTS

| | | |
|---|---|---|
| JP | 03-062553 | 3/1991 |
| JP | 2000-058545 | 2/2000 |
| JP | 2000-188550 | 7/2000 |

OTHER PUBLICATIONS

Rabaey, Digital Integrated Circuits, Chapter 9, Section 9.2.4, How to Counter Clock Skew Problems, 1996.
Chinese Office Action dated May 9, 2008 corresponding to U.S. Appl. No. 11/319,106, filed Dec. 27, 2005.

* cited by examiner

*Primary Examiner*—Linh V Nguyen
(74) *Attorney, Agent, or Firm*—Amin, Turocy & Calvin, LLP

(57) ABSTRACT

A D/A converter includes a plurality of current sources configured to be on or off according to input digital data; a constant voltage source configured to apply a constant voltage to the current sources; current supply wirings provided between the constant voltage source and the respective current source, the current supply wirings respectively having equal length from the constant voltage source to the respective current source; ground-side wirings summing up output currents from the plurality of current sources; and output terminals connected to the ground-side wirings, the output terminals outputting analogue data corresponding to the input digital data.

15 Claims, 10 Drawing Sheets

D/A CONVERTER AND COMMUNICATION APPARATUS

CROSS-REFERENCE TO RELATED APPLICATION

This application is based upon and claims the benefit of priority from the prior Japanese Patent Applications No. 2004-381894, filed on Dec. 28, 2004, the entire contents of which is incorporated herein by reference.

1. Field of the Invention

The present invention relates to a D/A converter and a communication apparatus, and relates more particularly to wiring of a power source of the D/A converter.

2. Related Art

A conventional digital-analog (D/A) converter has different wiring lengths from a current supply point (or a ground point) to each current source as shown in FIG. 8. Therefore, a voltage supplied to the source of a P-type MOS transistor (or an N-type MOS transistor) as a current source decreases in the order of Vss1, Vss2, and Vss3 due to a voltage drop (or an IR drop) generated by a wiring parasitic resistance. Following the voltage drop, output currents of the current sources also decrease in the order of i1, i2, and i3. Consequently, there occurs a distortion in the output analog signals.

Designing an analog block of a converter without a redundant wiring is known (Japanese Patent Application (Kokai) No. H3-62553). However, the problem generated due to the above wiring parasitic resistance is not discussed.

In general, an error of a current output of a D/A converter is a sum of an error caused by an output resistance of a current source transistor and an error caused by an IR drop. When a power source voltage decreases following a miniaturization of a CMOS element, a sufficient voltage cannot be applied to a current source transistor that is used for the D/A converter. Therefore, problems arise that an output resistance of the current source increases, and a current error increases. As explained above, the error caused by the output resistance increases at the low power source voltage. Accordingly, in order to suppress the sum of current errors to within a specification, a reduction of the IR drop is strongly desired at the low power source voltage.

SUMMARY OF THE INVENTION

The present invention has been made in the light that the above problem of non-uniformity in the voltage drop is generated in the wiring parasitic resistance cased by the irregular wiring lengths in the D/A converter. An object of the present invention is to provide an accurate D/A converter which can suppress a distortion in the output analog signals.

A D/A converter according to an embodiment of the present invention includes a plurality of current sources configured to be on or off according to input digital data; a constant voltage source configured to apply a constant voltage to the current sources; current supply wirings provided between the constant voltage source and the respective current source, the current supply wirings respectively having equal length from the constant voltage source to the respective current source; ground-side wirings summing up output currents from the plurality of current sources; and output terminals connected to the ground-side wirings, the output terminals outputting analogue data corresponding to the input digital data.

A D/A converter according to an embodiment of the present invention includes a plurality of current sources configured to be on or off according to input digital data; a ground terminal configured to be kept at ground voltage; ground-side wirings provided between the ground terminal and the respective current source, and respectively having equal length from the respective current source to the ground terminal; current supply wirings supplying current to the current sources; and output terminals connected to the current supply wirings, the output terminals outputting analogue data corresponding to the input digital data.

A communication apparatus according to an embodiment of the present invention includes a plurality of current sources controlled to be on or off according to input digital data; a constant voltage source applying a constant voltage to the current sources; current supply wirings provided between the constant voltage source and the respective current source, the current supply wirings respectively having equal length from the constant voltage source to the respective current source; ground-side wirings summing up output currents from the plurality of current sources; and output terminals connected to the ground-side wirings, the output terminals outputting analogue data corresponding to the input digital data.

DETAILED DESCRIPTION OF THE INVENTION

Embodiments of the present invention will be described below with reference to the drawings.

Figure 1:
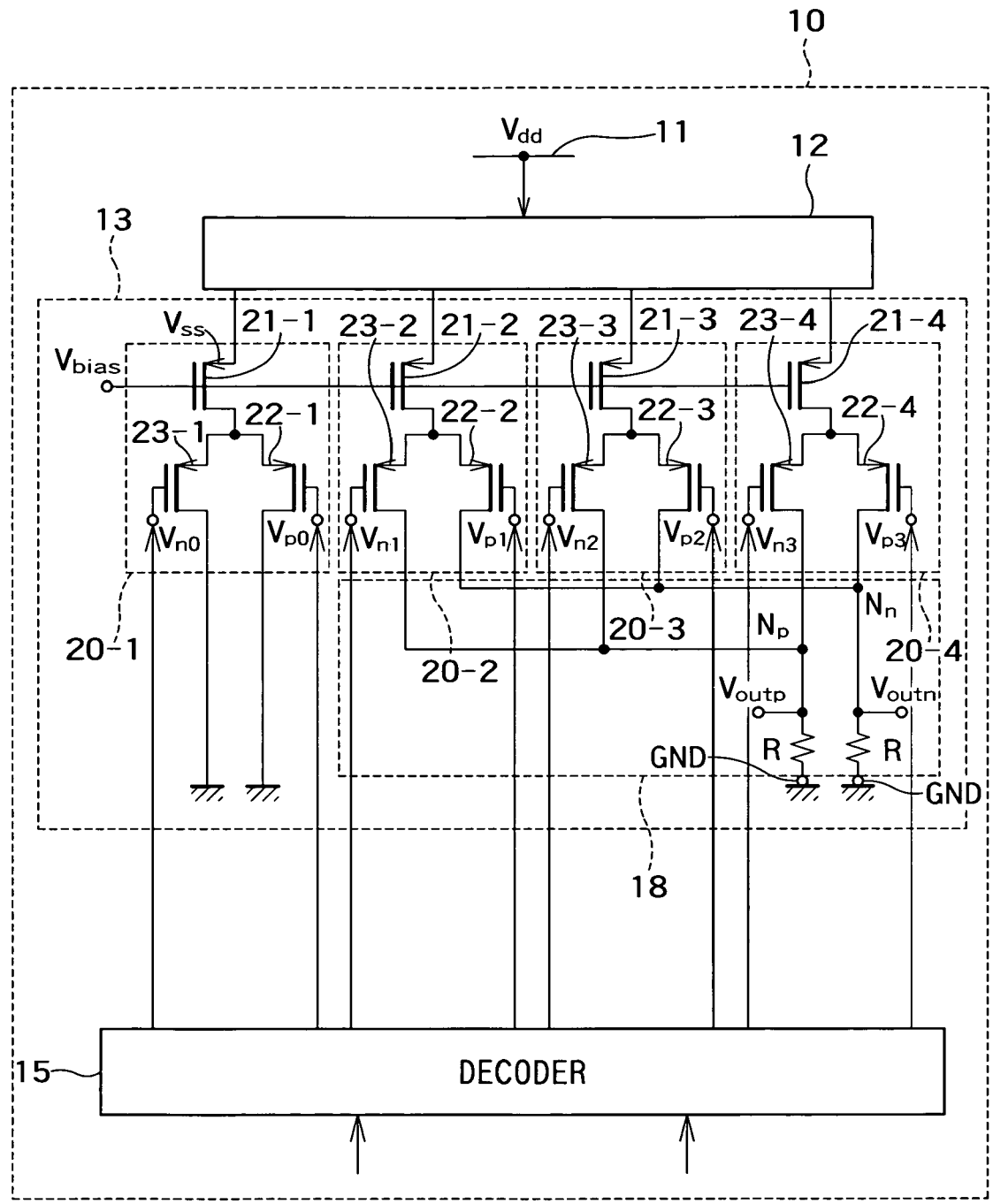
FIG. 1 shows a basic configuration of a D/A converter according to embodiments of the present invention.

FIG. 1 shows a basic configuration of a D/A converter according to embodiments of the present invention that does not generate a distortion in output analog signals. A D/A converter 10 shown in FIG. 1 is a current-cell type digital-analog converter which sums up output currents flowing from plural current sources controlled to be on/off according to input digital data and which outputs the summation as analog data. This digital-analog converter includes a current supply point 11, a current supply wiring 12, a current cell array 13, a current-voltage conversion resistor 14, and a decoder 15.

In the D/A converter 10 shown in FIG. 1, the decoder 15 receives a digital signal and decodes the digital signal. Then, the decoder 15 generates an output signal corresponding to an input code of the digital signal. In the example shown in FIG. 1, the decoder 15 decodes two-bit digital signals D1 and D0, and outputs signals Vn0 to Vn3 and Vp0 to Vp3 corresponding to these digital signals.

The current cell array 13 shown in FIG. 1 includes four current cells 20-1 to 20-4. The current cells 20-1 to 20-4 include P-type MOS transistors (hereinafter referred to as PMOS) 21-1 to 21-4 as current sources, and pairs of PMOSs 22-1 to 22-4 and 23-1 to 23-4 as switch circuits, respectively. In the current cells 20-1 to 20-4, drains of the PMOSs 21-1 to 21-4 as the current sources are connected to sources of the PMOSs 22-1 to 22-4 and 23-1 to 23-4, respectively. Sources of the PMOSs 21-1 to 21-4 are connected to the current supply point 11 via the current supply wiring 12.

Drains of the PMOSs 22-1 and 23-1 which operate as the switch circuits are grounded. Drains of the PMOSs 22-2 to 22-4 and 23-2 to 23-4 are connected to internal nodes Nn and Np, respectively. Output currents of the current cells 20-2 to 20-4 are summed up at the nodes Nn and Np. A bias voltage Vbias is applied in common to gates of the PMOSs 21-1 to 21-4. The output signals Vn0 to Vn3 and Vp0 to Vp3 from the decoder 15 are input to gates of the PMOSs 22-1 to 22-4 and 23-1 to 23-4, respectively.

D/A converter 10 comprises a ground terminal GND, resistors R, output terminals Voutn and Voutp, and ground-side wirings 18. The lengths of the ground-side wirings 18 from drains of PMOS 22-2 to 22-4 and 23-2 to 23-4 to the ground terminal GND are equal to each other. The resistors R are respectively connected between the nodes Nn and the ground terminal GND and between the nodes Np and the ground terminal GND. The output terminals Voutn and Voutp are respectively connected between the nodes Nn and the resistor R and between the nodes Np and the resistor R.

Since each length of the current supply wirings 12 is equal and each length of the ground-side wirings 18 is equal, a current, which corresponds to a digital signal inputted from Vn1 to Vn3 and Vp1 to Vp3, flows from the node Nn and Np to the ground terminal GND. A current difference between the current from the node Nn to the ground terminal GND and the current from the node Np to the ground terminal GND is outputted as a potential difference between the output terminal Voutn and the output terminal Voutp due to the resistors R. In other word, the D/A converter 10 is configured so that it receives digital signals at terminals Vn1 to Vn3 and Vp1 to Vp3 and outputs the differential voltage corresponding to the digital signals from the out put terminals Voutn and Voutp.

In this configuration, the current cells 20-2, 20-3, and 20-4 constituting the current cell array 13 are utilized, but the current cell 20-1 is not utilized. From the viewpoint of the balance of wiring, it is preferable that the current cells are prepared symmetrically. Therefore, when the actually necessary number of wirings is an odd number, a current cell at the branch point is not used in some cases like this configuration. This is similarly applied to the following embodiments.

The PMOSs 21-1 to 21-4 as the current sources of the current cells 20-1 to 20-4 operate in the saturation state. Output currents of the PMOSs 21-1 to 21-4 are proportional to the square of the difference between the voltage Vss supplied from the current supply point 11 to the sources of the PMOSs 21-1 to 21-4 and the bias voltage Vbias. That is, the output currents are proportional to $(Vss-Vbias)^2$.

The voltage Vss supplied to the sources of the PMOSs 21-1 to 21-4 becomes lower than a power source voltage Vdd due to the IR drop caused by the wiring parasitic resistance of the current supply wiring 12. This wiring parasitic resistance depends on a wiring length from the current supply point 11 to each of the current cells 20-1 to 20-4. An aspect of the present embodiment is that the wiring lengths from the current supply point 11 to the each current cells 20-1 to 20-4 are made substantially equal, respectively.

According to the D/A converter, the lengths of the current supply wirings from the current supply point or the ground point to the each current sources are made substantially equal, respectively. Therefore, voltage drops attributable to the lengths of the wiring from the current supply point or the ground point to the current sources are substantially equal. Consequently, there is no variation in the output currents of the currents sources, thereby distortions in the output analog signals are decreased. Particularly, this D/A converter is effective because the D/A converter can decrease the IR drop during the operation at a low power source voltage at which a current error attributable to the output resistance increases conventionally.

First Embodiment

Figure 2:
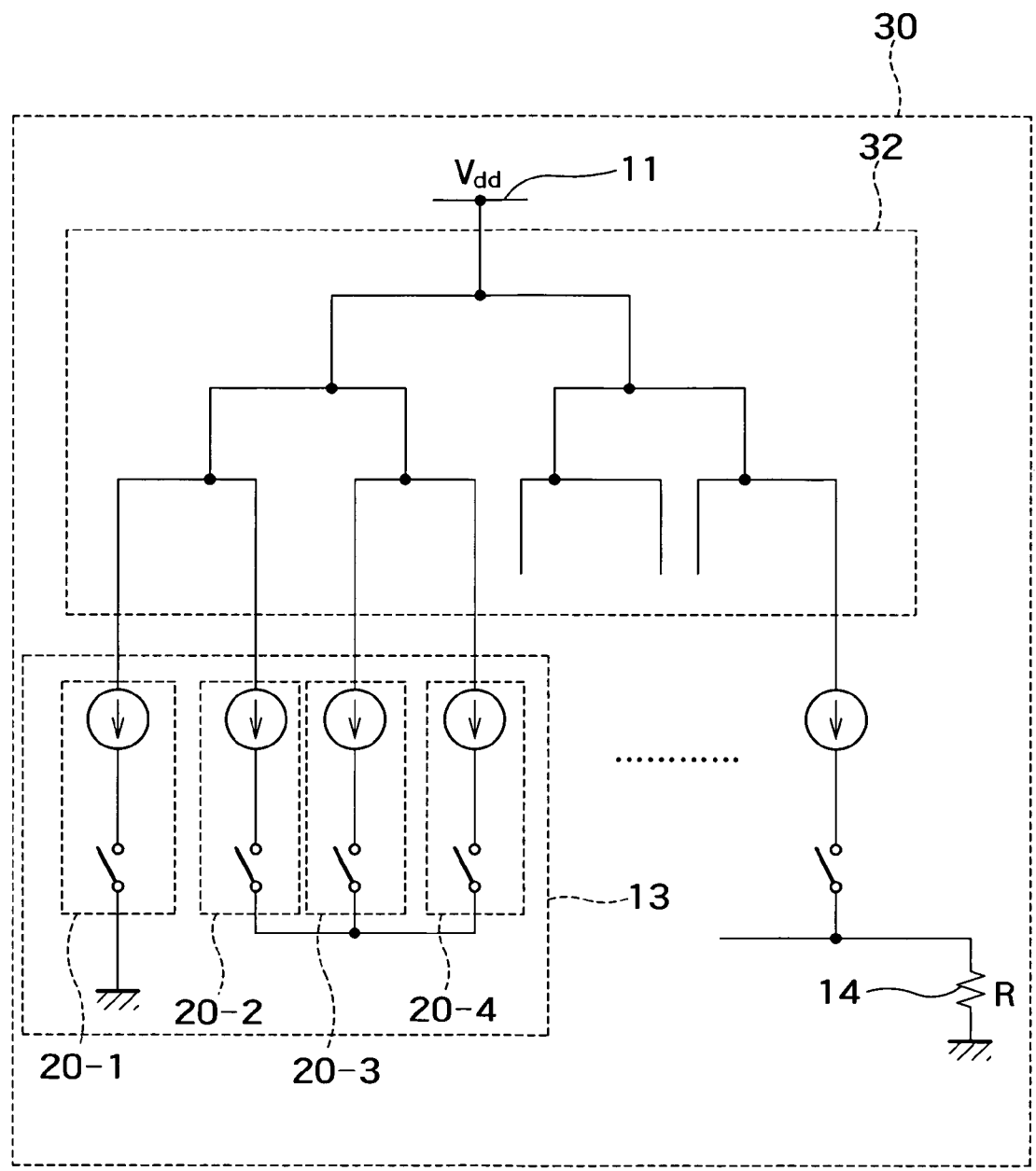
FIG. 2 shows a configuration example of a D/A converter according to a first embodiment of the present invention.

FIG. 2 shows a configuration of a D/A converter according to a first embodiment of the present invention. Specifically, FIG. 2 is a schematic configuration diagram of a D/A converter 30 which has a current supply wiring 32 in a tree structure, in place of the current supply wiring 12 connecting between the current supply point 11 and the current cells 20-1 to 20-4 in the D/A converter 10 shown in FIG. 1. Thereby, the lengths of wirings in the current supply wiring 32 are substantially equal.

The current supply wiring 32 of the D/A converter 30 shown in FIG. 2 has a two-branch structure that makes substantially equal the wiring lengths from the power source 11 to the current cells 20-1 to 20-4, respectively. Therefore, the currents flowing through the branches from the power source 11 to the current cells 20-1 to 20-4 are equalized. Therefore, values of IR drops arose in the routes from the current supply point 11 to the current cells 20-1 to 20-4 become all equal when the current passes through the current supply wiring 32. Consequently, all voltages Vss supplied to the sources of the PMOSs 21-1 to 21-4 as the current sources of the current cells 20-1 to 20-4 become equal. This has advantages of preventing a variation in the output currents of the PMOSs 21-1 to 21-4 as the current sources due to the IR drop, and improving precision of the D/A converter. Particularly, this D/A converter is effective because the D/A converter can reduce the IR drop during the operation at a low power source voltage at which a current error attributable to the output resistance increases conventionally.

In the present embodiment, the current cell 20-1 provided at the branch point is not actually utilized.

According to the present D/A converter, the current supply wiring has a two-branch structure branched into two at the branch point of the wiring on each story. The lengths of the wirings from the current supply point or the ground point to the respective current sources are substantially equal. Therefore, distortion in the output analog signals can be reduced.

Second Embodiment

Figure 3:
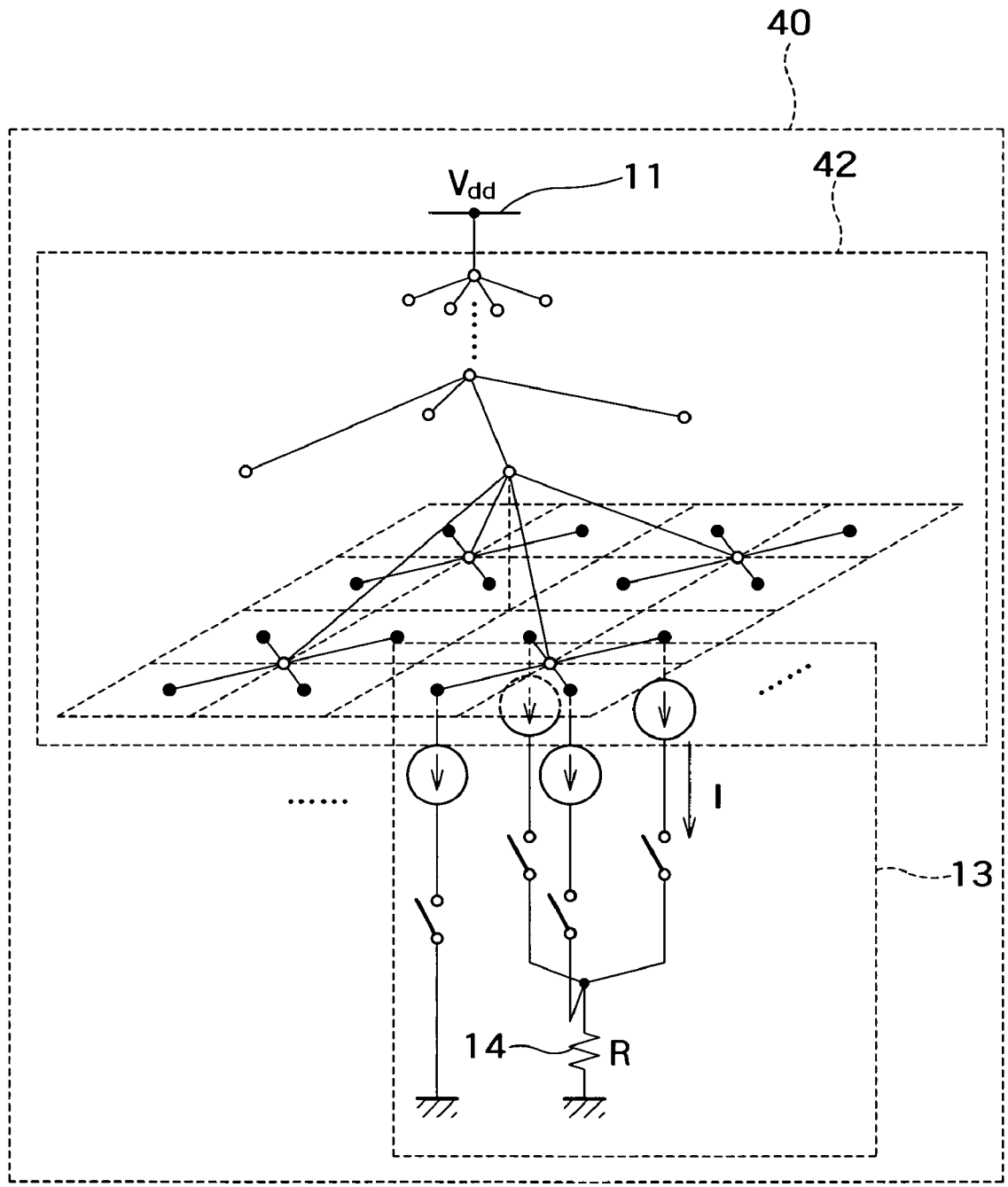
FIG. 3 shows a configuration example of the D/A converter according to a second embodiment of the present invention.

A D/A converter according to a second embodiment of the invention is explained next. FIG. 3 is a schematic configuration diagram of the D/A converter according to the second embodiment. A D/A converter 40 shown in FIG. 3 has a current supply wiring 42 which has a multilayer wiring structure, each layer of the multilayer wiring structure being radially wired, in place of the current supply wiring 12 shown in FIG. 1.

Figure 4:
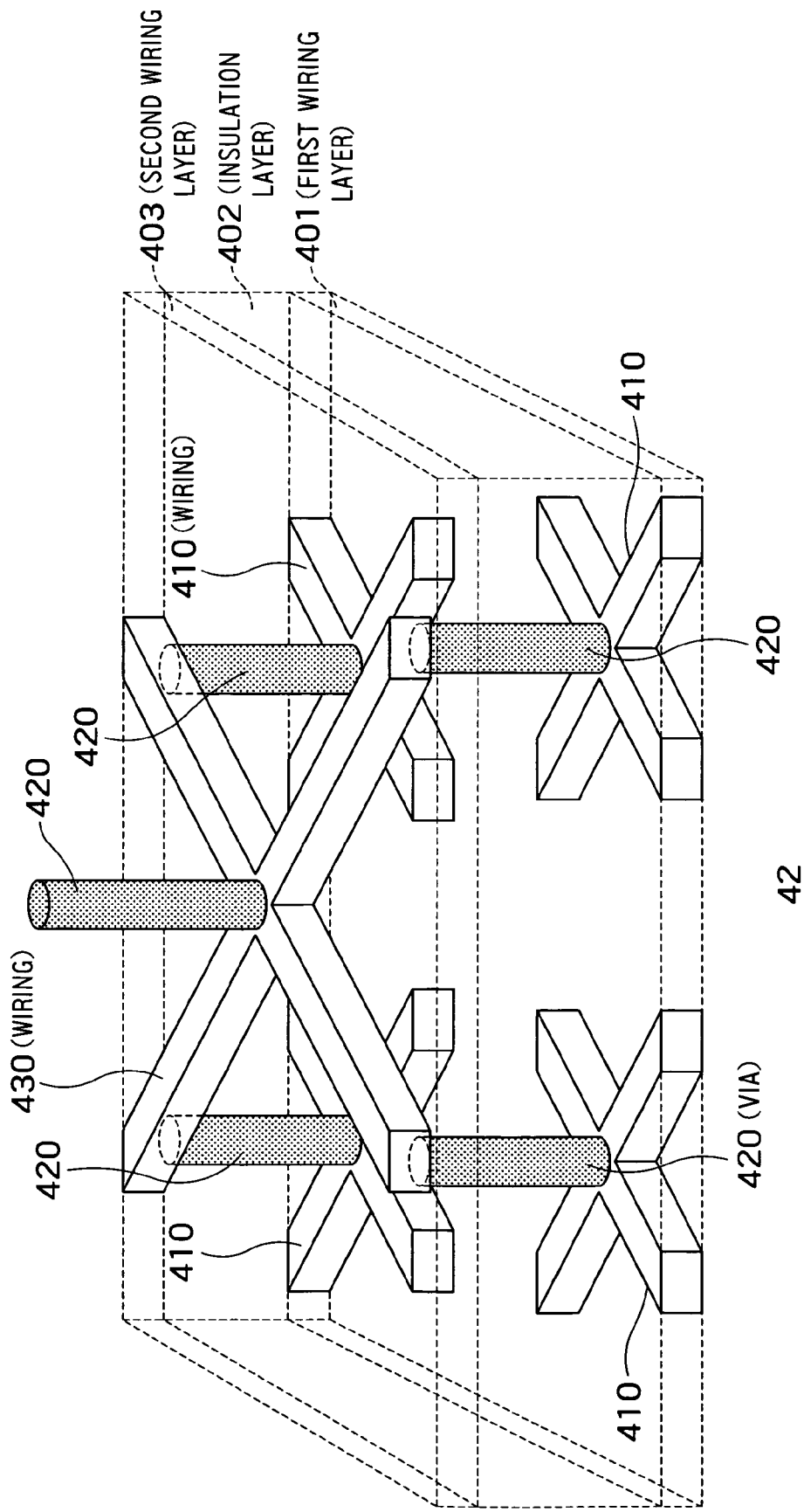
FIG. 4 is a perspective view showing the configuration of the current supply wiring 42.

FIG. 4 is a perspective view showing the configuration of the current supply wiring 42. The current supply wiring 42 has a lamination structure including a first wiring layer 401, an insulation layer 402 provided on the first wiring layer 401, and a second wiring layer 403 provided on the insulation layer 402. It is needless to mention that the current supply wiring 42 has a structure having more layers laminated.

Wirings 410 formed radially (in an X shape, for example) are provided on the first wiring layer 401, and wirings 430 formed radially (in an X shape, for example) are provided on the second wiring layer 403. In the first and the second wiring layers 401 and 403, an insulator is filled in parts other than the wirings 410 and 430. With this structure, the wirings 410 are electrically insulated, and the wirings 430 are electrically insulated. An insulation layer 402 is provided between the first wiring layer 401 and the second wiring layer 403. Vias 420 are provided in the insulation layer 402. The intersectional point of branches of the wiring 410 is connected to the branch point of the wiring 430 through the via 420.

Each of the wirings 410 and the wirings 430 has four radially extended branch lines, respectively. A distance from the intersectional point to each end of branches of the wiring 410 (the length of each branch of each wiring 410) is equal. A distance from the intersectional point to each end of branches of the wiring 430 (the length of each branch of each wiring 430) is also equal. However, the length of the branch line of the wiring 30 is not necessarily required to be equal to the length of the branch line of the wiring 410. Because even if the length of the branch line of the wiring 30 is not equal to that of the wiring 410, such a structure can make equal the lengths of the wirings from the current supply point or the ground point to the respective current sources. Thus, the current supply wiring 42 shown in FIG. 3 can be implemented in the manner as shown in FIG. 4.

The wiring lengths of the four radially-wired branch lines are substantially equal, therefore, the currents passing through these branch lines are substantially equal. As a result, IR drop values arose in the routes from the current supply point 11 to the current cells 20-1 to 20-4 become all equal when the current passes through the current supply wiring 42, in the same manner as that when the D/A converter 30 shown in FIG. 2 is used.

Consequently, all voltages Vss supplied to the sources of the PMOSs 21-1 to 21-4 as the current sources of the current cells 20-1 to 20-4 become equal. This has the advantage of preventing a variation in the output currents of the PMOSs 21-1 to 21-4 due to the IR drop in the same manner as that when the D/A converter 30 shown in FIG. 2 is used.

Further, according to the present embodiment, a wiring can be achieved in a straight line from each branch point to a branch point in the next layer by using the multilayer wiring structure. Therefore, a total wiring length of the second embodiment can be shorter than that of the D/A converter 30 shown in FIG. 2 and that of a D/A converter described later. Further, since the wiring in each layer can be made thicker and shorter by using the multilayer wiring structure, the IR drop can be reduced. Therefore, the precision of the D/A converter, which is provided on a small area and is low power consumption, can be improved.

According to the present D/A converter, the current supply wiring has a multilayer wiring structure, and the wiring in each layer has a radial shape. The wiring is connected from each end of the radial branches to the wiring of the lower layer. Therefore, the lengths of the wirings from the current supply point or the ground point to the respective current sources are substantially equal. Consequently, the distortion of the output analog signals can be decreased. Particularly, this D/A converter is effective because the D/A converter can reduce the IR drop during the operation at a low power source voltage at which a current error attributable to the output resistance increases conventionally.

Third Embodiment

Figure 5:
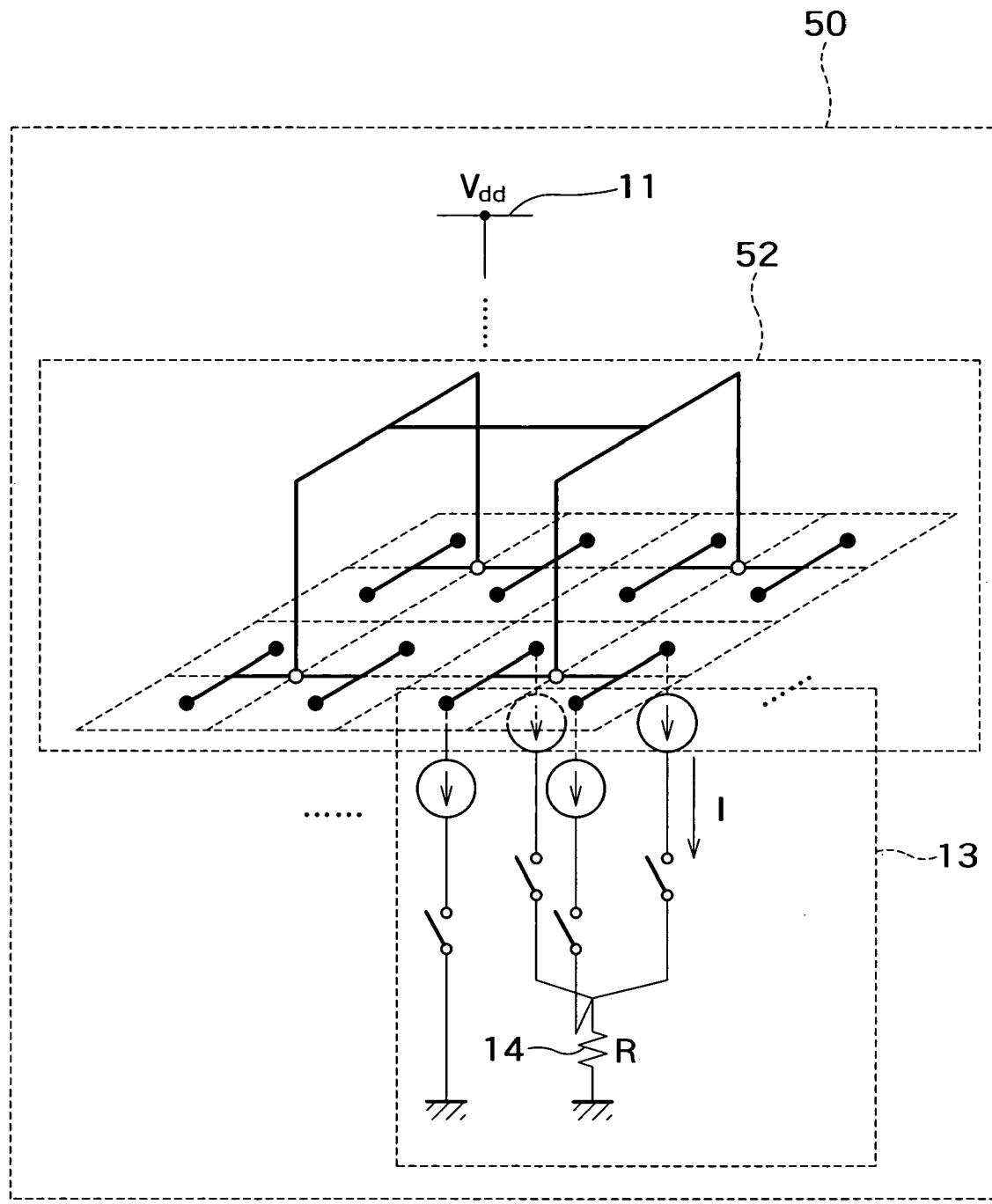
FIG. 5 shows a configuration example of the D/A converter according to a third embodiment of the present invention.

A D/A converter according to a third embodiment of the invention is explained next with reference to FIG. 5. FIG. 5 is a schematic configuration diagram of the D/A converter according to the third embodiment. A D/A converter 50 shown in FIG. 5 has a current supply wiring 52 having a multilayer wiring structure, each layer of the multilayer wiring structure being wired in an "H" shape, in place of the current supply wiring 12 shown in FIG. 1.

Figure 6:
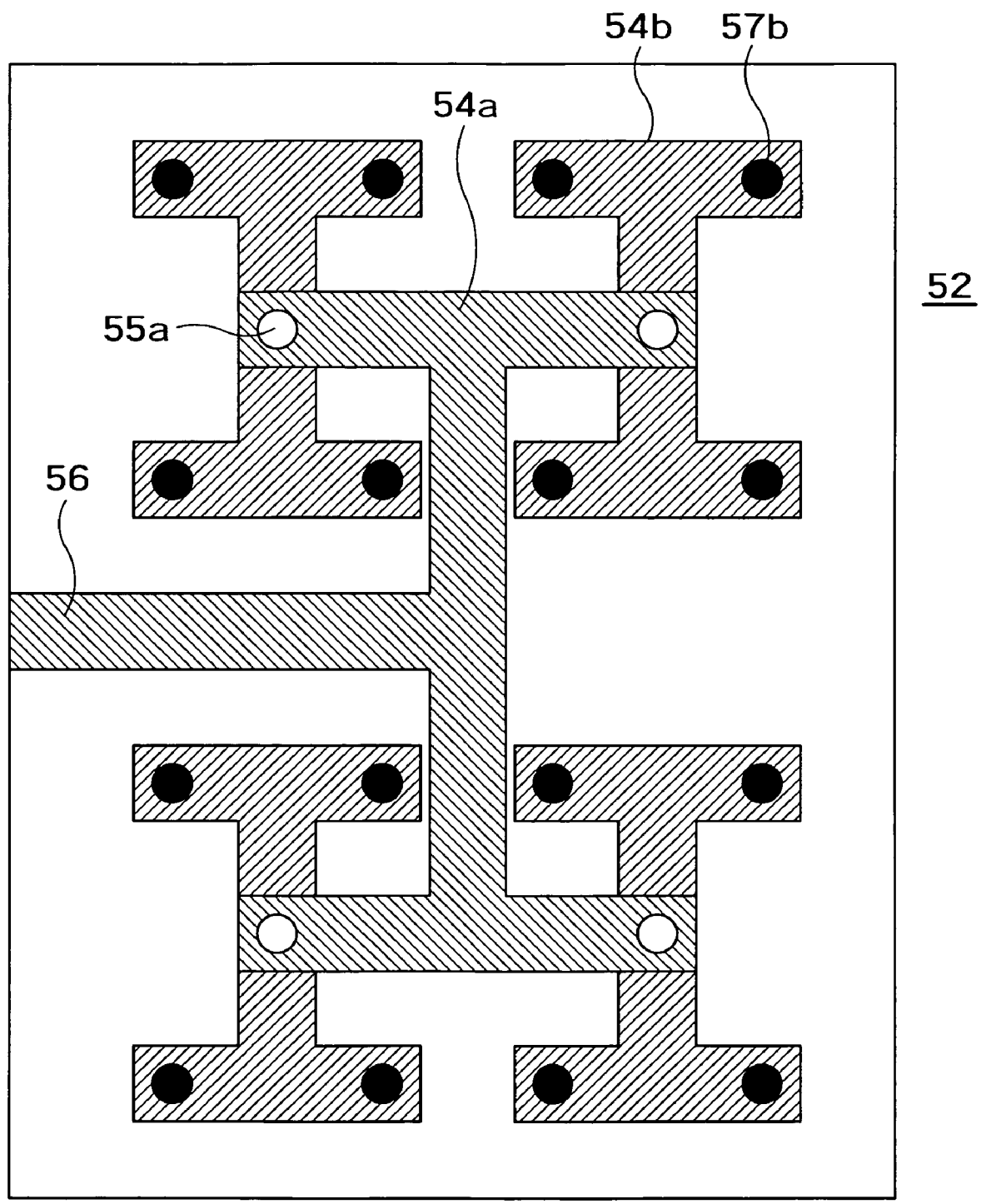
FIG. 6 shows an example of the wiring pattern of the current supply wiring 52 according to the third embodiment of the present invention.

FIG. 6 is top plan view of an example of the actual wiring pattern according to the third embodiment. In FIG. 6, the current supply wiring 52 has two layers of an upper layer and a lower layer. Each white circle point 55a of a H-shape pattern 54a in the upper layer is connected to a center position of each H-shape pattern 54b in the lower layer. The H-shape pattern 54a in the upper layer has a pattern 56 at the center that is connected to the power source Vdd. Each black circle point 57b at each branch point of each H-shape pattern 54b in the lower layer is connected to the current source shown in FIG. 5.

According to the present embodiment, the wiring lengths of the four branch lines wired in the H-shape are equal, and the currents passing through these branch lines are also equal. Therefore, IR drop values arose in the routes from the current supply point 11 to the current cells 20-1 to 20-4 become all equal when the current passes through the current supply wiring 52 in the same manner as that when the D/A converter 30 shown in FIG. 2 is used.

Therefore, all voltages Vss supplied to the sources of the PMOSs 21-1 to 21-4 as the current sources of the current cells 20-1 to 20-4 become equal. Consequently, this has the advantage of preventing a variation in the output currents of the PMOSs 21-1 to 21-4 due to the IR drop in the same as the D/A converter 30 shown in FIG. 2.

Further, according to the present embodiment, because the multilayer wiring structure is used, a total wiring length of the third embodiment can be shorter than that of the D/A converter 30 shown in FIG. 2, and the width of the wiring in each layer can be wider than that of the D/A converter 30. Therefore, the precision of the D/A converter, which is provided on a small area and is low power consumption, can be improved.

According to the present D/A converter, the lengths of the wirings from the current supply point or the ground point to the respective current sources are substantially equal. Consequently, the distortion of the output analog signals can be decreased.

Particularly, this D/A converter is effective because the D/A converter can reduce the IR drop during the operation at a low power source voltage, at which a current error attributable to the output resistance increases conventionally.

Fourth Embodiment

Figure 7:
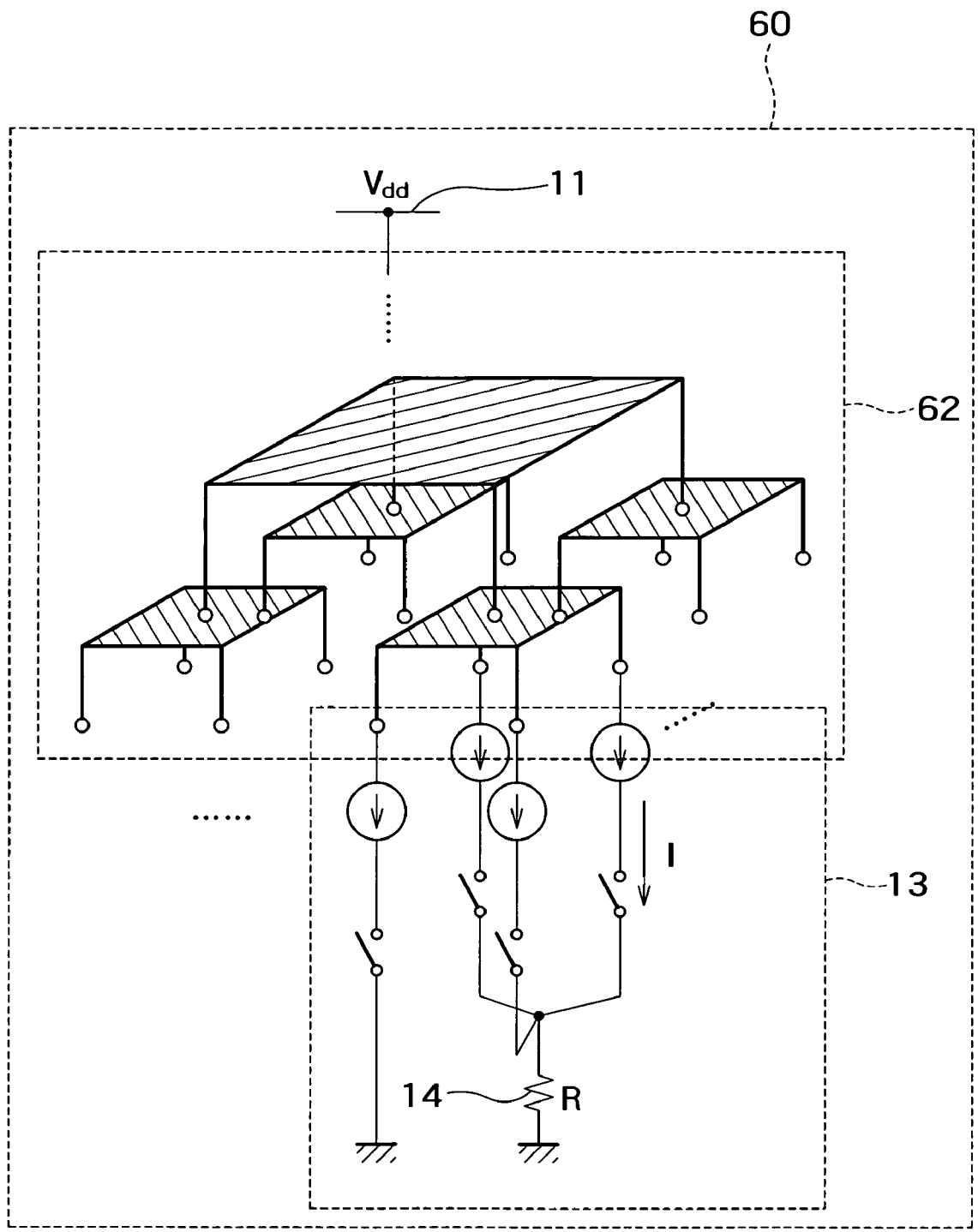
FIG. 7 shows a configuration example of the D/A converter according to the fourth embodiment of the present invention.
Figure 8:
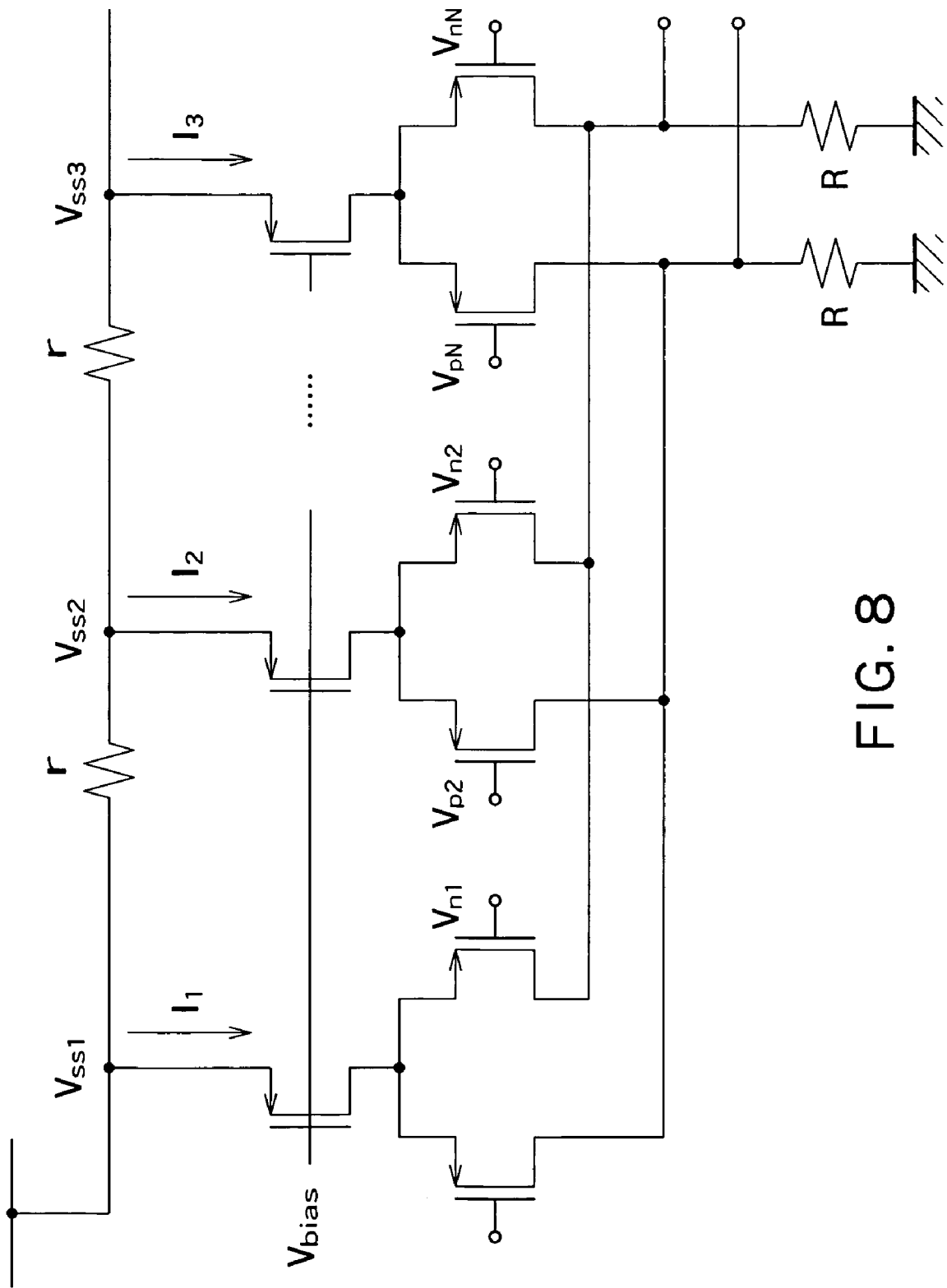
FIG. 8 is an explanatory diagram for explanation of the problems in a conventional D/A converter.

A D/A converter according to a fourth embodiment of the invention is explained next. FIG. 7 is a schematic configuration diagram of the D/A converter according to the fourth embodiment. A D/A converter 60 shown in FIG. 7 has a current supply wiring 62 having a multilayer wiring structure, each layer of the multilayer wiring structure being wired in a rectangular (or square) shape, in place of the current supply wiring 12 shown in FIG. 1.

Each of four corners of the rectangular (or square) wiring in each layer is connected to the center of the rectangular (or square) wiring in the lower layer. The wiring lengths from the center to the respective four corners of the rectangular (or square) wiring in each layer are equal, and the currents passing through these routes are also equal. Therefore, IR drop values arose in the routes from the current supply point 11 to the current cells 20-1 to 20-4 become all equal when the current passes through the current supply wiring 62, in the same manner as the D/A converter 30 shown in FIG. 2. Consequently, all voltages Vss applied to the sources of the PMOSs 21-1 to 21-4 as the current sources of the current cells 20-1 to 20-4 become equal. This has the advantage of preventing a variation in the output currents of the PMOSs 21-1 to 21-4 due to the IR drop, in the same manner as the D/A converter 30.

While a square wiring shape is explained in the above embodiment, a circular wiring shape can be also used.

According to the present embodiment, a multilayer wiring structure is used, and the current supply wiring is formed as a plane not as a line. Therefore, a total wiring length can be made shorter than that of the D/A converter 30 shown in FIG. 2, thereby further decreasing the resistance of the wiring. Consequently, there is the advantage that the precision of the D/A converter, which is provided on a small area and is low power consumption, can be improved.

According to the present D/A converter, the lengths of the wirings from the current supply point or the ground point to the respective current sources are substantially equal. Therefore, the distortion of the output analog signals can be reduced.

Further, the wiring in each layer of the fourth embodiment can be made wider and shorter by using the multilayer wiring structure. Therefore, the IR drop can be reduced.

Particularly, this D/A converter is effective because the D/A converter can decrease the IR drop during the operation at a low power source voltage, at which a current error attributable to the output resistance increases conventionally.

Fifth Embodiment

Figure 9:
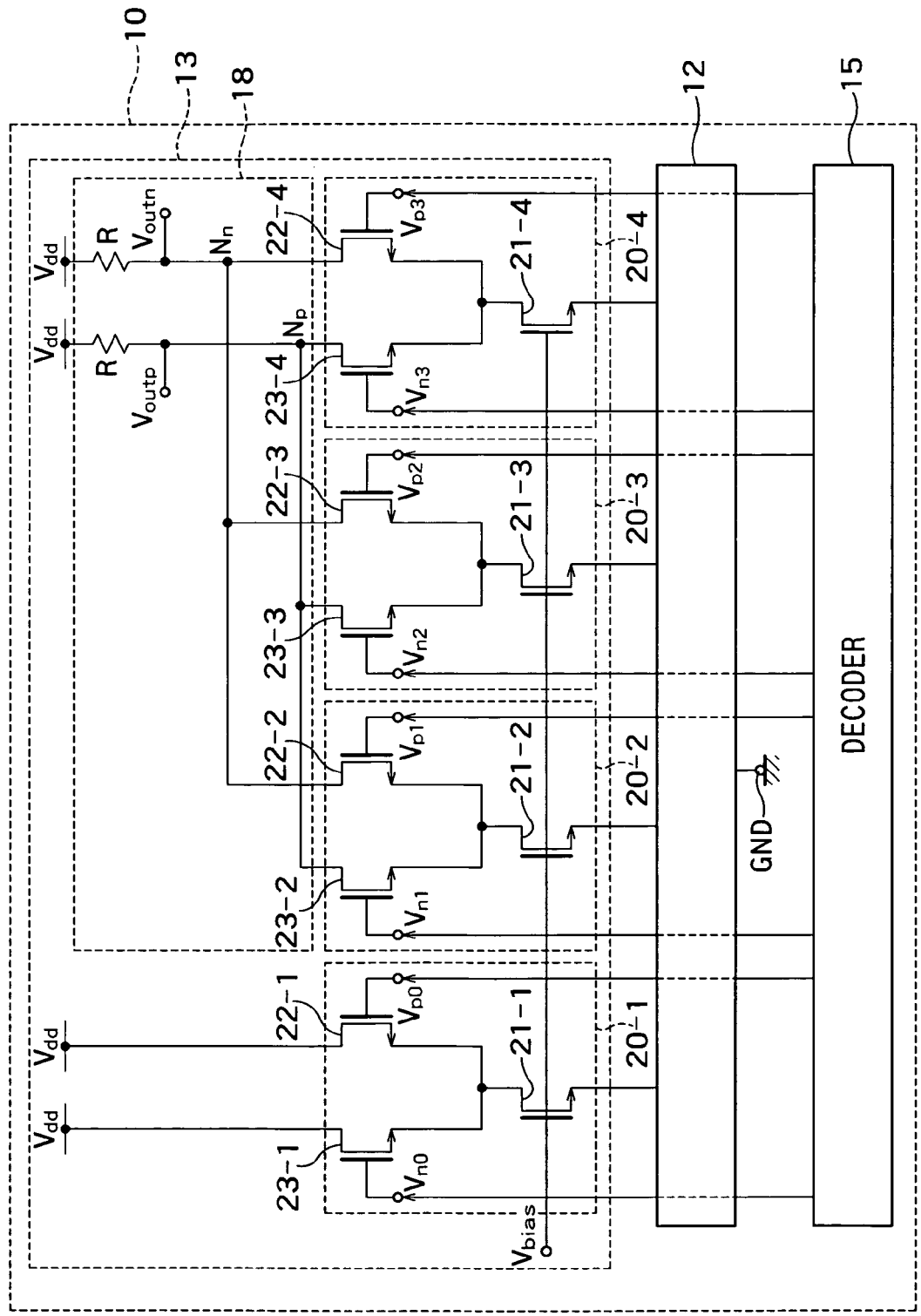
FIG. 9 shows a configuration example of the D/A converter according to the fifth embodiment of the present invention.

FIG. 9 shows a constitution of D/A converter 10 according to fifth embodiment of the invention.

In the above embodiments, the D/A converter 10 flows current from the current supply wirings 12 to the current cell array 13.

Figure 10:
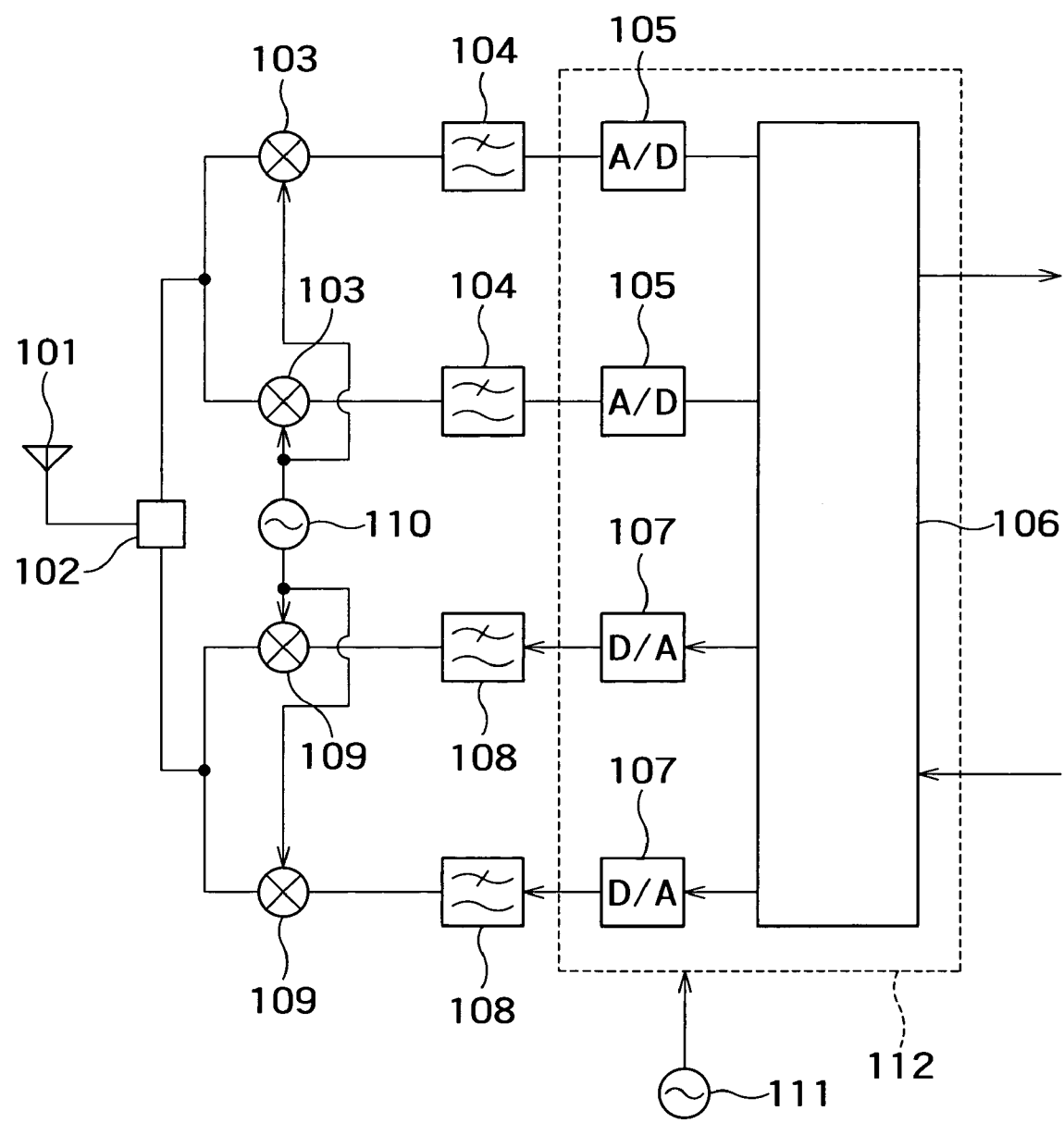
FIG. 10 shows a complex-system shared terminal according to an embodiment.

However, as shown in FIG. 10, it is possible that the D/A converter 10 flows current from the current cell array 13 to the current supply wirings 12 by inversely connecting the power source voltage Vdd and the ground to the D/A converter 10. In this case, the ground may be regarded as the constant voltage source in claim 1. Further, the transistors 21-1 to 21-4, 22-1 to 22-4 and 23-1 to 23-4 in the current cells 20-1 to 20-4 are constructed by NMOSs instead of PMOSs. The other configuration of the fifth embodiment may be same as the configuration of either embodiment mentioned above. Even if the D/A converter 10 has such as configuration of the fifth embodiment, the D/A converter 10 can obtain the advantages of either embodiment mentioned above.

While constructing the current cells using the P-type MOS transistors is described in the above embodiments, N-type MOS transistors can be also used as well as the P-type MOS transistors. The present invention can be also applied to a D/A converter constructed by bipolar transistors.

The D/A converters according to the above embodiments can be applied to the following communication apparatus.

FIG. 10 is a circuit diagram showing a terminal sharing a complex system according to an embodiment. A configuration and an operation principle of a receiving unit are explained first. A signal received by a antenna 101 for transmission and reception passes through a transmitter and receiver (or a duplexer) 102. Thereafter, a reception mixer pair 103 mixes this signal with a reference signal having substantially the same frequency as that of a reception signal supplied from a local oscillator 110, and directly frequency-converts the signal into a baseband signal.

A reception baseband filter pair 104 band-limits the I and Q outputs of the baseband signal which is obtained by frequency-conversion at the reception mixer pair 103. This filter pair 104 is provided to have an anti-aliasing function at a latter-stage A/D converter 105 and to prevent the A/D converter 105 from being saturated due to an interference wave other than a desired wave. The A/D converter 105 converts a digital signal into an analog signal. A digital signal processing unit 106 executes various kinds of signal processing such as a digital modulation and demodulation, a channel codec, a voice codec, and a TDMA processing.

A configuration and an operation principle of a transmitting unit are explained next. In the transmitting unit, the D/A converter 107 converts digital I and Q baseband signals generated at the digital signal processing unit 106 into an analog signal. A normal D/A converter and a ΔΣ type over-sampling type D/A converter are used for the D/A converter 107. A filter 108 at a latter stage of the D/A converter 107 is used to remove aliasing noise generated from the D/A converter 107. The filter 108 may be a filter having a lowpass characteristic. An orthogonal modulator constituted by a mixer pair 109 directly frequency-converts a transmission baseband signal passing through the filter 108 into a signal of radio frequency band. The transmission signal frequency-converted into the radio carrier band passes through the transmitter and receiver 102, and is emitted to the air from the antenna 101.

The D/A converters according to the first to the fourth embodiments can be used for the D/A converter 107. A communication apparatus having the D/A converter 107 can obtain the effects described in the above embodiments. Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A D/A converter comprising:
   a plurality of current sources configured to be on or off according to input digital data;
   a constant voltage source configured to apply a constant voltage to the current sources;
   current supply wirings provided between the constant voltage source and the respective current source, the current supply wirings respectively having equal length from the constant voltage source to the respective current source;
   ground-side wirings summing up output currents from the plurality of current sources; and
   output terminals connected to the ground-side wirings, the output terminals outputting analogue data corresponding to the input digital data, wherein
   the current sources are constituted by transistors, and
   the length of the respective current supply wiring is same as a length from the constant voltage source to a source or an emitter of the transistor.

2. The D/A converter according to claim 1 further comprising:
   a ground terminal connected to the ground-side wirings, the ground terminal being kept at ground voltage, wherein lengths of the ground-side wirings from the current sources to the ground terminal are equal in each layer.

3. The D/A converter according to claim 1, wherein the respective current supply wiring has a two-branch structure at a connecting node of the current supply wiring.

4. A D/A converter comprising:
a plurality of current sources configured to be on or off according to input digital data;
a constant voltage source configured to apply a constant voltage to the current sources;
current supply wirings provided between the constant voltage source and the respective current source, the current supply wirings respectively having equal length from the constant voltage source to the respective current source;
ground-side wirings summing up output currents from the plurality of current sources; and
output terminals connected to the ground-side wirings, the output terminals outputting analogue data corresponding to the input digital data, wherein
the current supply wirings are formed in a multilayer wiring structure,
the current supply wirings in each layer are formed radially, and
one of the current supply wirings in the first layer of the multilayer wiring structure is connected to the current supply wirings in a lower layer under the first layer at the branch points of the current supply wiring in the first layer.

5. A D/A converter comprising:
a plurality of current sources configured to be on or off according to input digital data;
a constant voltage source configured to apply a constant voltage to the current sources;
current supply wirings provided between the constant voltage source and the respective current source, the current supply wirings respectively having equal length from the constant voltage source to the respective current source;
ground-side wirings summing up output currents from the plurality of current sources; and
output terminals connected to the ground-side wirings, the output terminals outputting analogue data corresponding to the input digital data, wherein
the current supply wirings are formed in a multilayer wiring structure,
the current supply wirings are formed in a same radial pattern in respective layer, and
the current supply wirings in a first layer of the multilayer wiring structure are connected to a center of the respective current supply wiring in a lower layer under the first layer.

6. A D/A converter comprising:
a plurality of current sources configured to be on or off according to input digital data;
a constant voltage source configured to apply a constant voltage to the current sources;
current supply wirings provided between the constant voltage source and the respective current source, the current supply wirings respectively having equal length from the constant voltage source to the respective current source;
ground-side wirings summing up output currents from the plurality of current sources; and
output terminals connected to the around-side wirings, the output terminals outputting analogue data corresponding to the input digital data, wherein
the current supply wirings are formed in a multilayer wiring structure,
the current supply wirings in each layer are formed in a H-shape, and
one of the current supply wirings in the first layer of the multilayer wiring structure is connected to the current supply wirings in a lower layer under the first layer at the branch points of the current supply wiring in the first layer.

7. A D/A converter comprising:
a plurality of current sources configured to be on or off according to input digital data;
a constant voltage source configured to apply a constant voltage to the current sources;
current supply wirings provided between the constant voltage source and the respective current source, the current supply wirings respectively having equal length from the constant voltage source to the respective current source;
ground-side wirings summing up output currents from the plurality of current sources; and
output terminals connected to the ground-side wirings, the output terminals outputting analogue data corresponding to the input digital data, wherein
the current supply wirings are formed in a multilayer wiring structure,
the current supply wirings in each layer are formed in a rectangular shape, a square shape or a circular shape, and
one of the current supply wirings in the first layer of the multilayer wiring structure is connected to the current supply wirings in a lower layer under the first layer at the branch points of the current supply wiring in the first layer.

8. A D/A converter comprising:
a plurality of current sources configured to be on or off according to input digital data;
a constant voltage source configured to apply a constant voltage to the current sources;
current supply wirings provided between the constant voltage source and the respective current source, the current supply wirings respectively having equal length from the constant voltage source to the respective current source;
ground-side wirings summing up output currents from the plurality of current sources; and
output terminals connected to the ground-side wirings, the output terminals outputting analogue data corresponding to the input digital data, wherein
the current supply wirings are formed in a multilayer wiring structure,
lengths of the current supply wirings connecting between a connection node on the upper layer and a connection node on the lower layer are equal in each layer.

9. A D/A converter comprising:
a plurality of current sources configured to be on or off according to input digital data;
a ground terminal configured to be kept at ground voltage;
ground-side wirings provided between the ground terminal and the respective current source, and respectively having equal length from the respective current source to the ground terminal;
current supply wirings supplying current to the current sources; and output terminals connected to the current supply wirings, the output terminals outputting analogue data corresponding to the input digital data, wherein
the ground-side wirings are formed in a multilayer wiring structure,
the ground-side wirings in each layer are formed in a radial pattern, and
one of the ground-side wirings in the first layer of the multilayer wiring structure is connected to the ground-side wirings in a lower layer under the first layer at the branch points of the ground-side wiring in the first layer.

10. The D/A converter according to claim 9, wherein
the current sources are constituted by transistors, and
the length of the respective ground-side wiring is a length from a source or an emitter of the transistor to the ground terminal.

11. The D/A converter according to claim 9, wherein
the respective ground-side wiring has a two-branch structure at a connecting node of the ground-side wiring.

12. A D/A converter comprising:
a plurality of current sources configured to be on or off according to input digital data;
a ground terminal configured to be kept at ground voltage;
ground-side wirings provided between the ground terminal and the respective current source, and respectively having equal length from the respective current source to the ground terminal;
current supply wirings supplying current to the current sources; and
output terminals connected to the current supply wirings, the output terminals outputting analogue data corresponding to the input digital data, wherein
the ground-side wirings are formed in a multilayer wiring structure,
the ground-side wirings are formed in a same radial pattern in respective layer, and
the ground-side wirings in a first layer of the multilayer wiring structure are connected to a center of the respective ground-side wiring in a lower layer under the first layer at the branch points of the ground-side wiring in the first layer.

13. A D/A converter comprising:
a plurality of current sources configured to be on or off according to input digital data;
a ground terminal configured to be kept at ground voltage;
ground-side wirings provided between the ground terminal and the respective current source, and respectively having equal length from the respective current source to the ground terminal;
current supply wirings supplying current to the current sources; and
output terminals connected to the current supply wirings, the output terminals outputting analogue data corresponding to the input digital data, wherein
the ground-side wirings are formed in a multilayer wiring structure,
the ground-side wirings in each layer are formed in a H-shape, and
one of the ground-side wirings in the first layer of the multilayer wiring structure is connected to the ground-side wirings in a lower layer under the first layer at the branch points of the ground-side wiring in the first layer.

14. A D/A converter comprising:
a plurality of current sources configured to be on or off according to input digital data;
a ground terminal configured to be kept at ground voltage;
ground-side wirings provided between the ground terminal and the respective current source, and respectively having equal length from the respective current source to the ground terminal;
current supply wirings supplying current to the current sources; and
output terminals connected to the current supply wirings, the output terminals outputting analogue data corresponding to the input digital data, wherein
the ground-side wirings are formed in a multilayer wiring structure,
the ground-side wirings in each layer are formed in a rectangular shape, a square shape or a circular shape, and
one of the ground-side wirings in the first layer of the multilayer wiring structure is connected to the ground-side wirings in a lower layer under the first layer at the branch points of the ground-side wiring in the first layer.

15. A D/A converter comprising:
a plurality of current sources configured to be on or off according to input digital data;
a ground terminal configured to be kept at ground voltage;
ground-side wirings provided between the ground terminal and the respective current source, and respectively having equal length from the respective current source to the ground terminal;
current supply wirings supplying current to the current sources; and
output terminals connected to the current supply wirings, the output terminals outputting analogue data corresponding to the input digital data, wherein
the ground-side wirings are formed in a multilayer wiring structure,
lengths of the ground-side wirings connecting between a connection node on the upper layer and a connection node on the lower layer are equal in each layer.

* * * * *